(12) United States Patent
Hoffmann et al.

(10) Patent No.: US 10,324,431 B2
(45) Date of Patent: Jun. 18, 2019

(54) METHOD FOR MONITORING AN ELECTROMECHANICAL COMPONENT OF AN AUTOMATION SYSTEM

(71) Applicant: Phoenix Contact GmbH Co. KG, Blomberg (DE)

(72) Inventors: Ralf Hoffmann, Berlin (DE); Jens Heinrich, Falkensee (DE); Sebastian Heinrich, Berlin (DE); Christian Müller, Berlin (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 0 days.

(21) Appl. No.: 15/837,229

(22) Filed: Dec. 11, 2017

(65) Prior Publication Data
US 2018/0164759 A1    Jun. 14, 2018

(30) Foreign Application Priority Data
Dec. 12, 2016    (DE) .......................... 10 2016 124 083

(51) Int. Cl.
G05B 15/02    (2006.01)
H01H 47/00    (2006.01)
H01H 47/22    (2006.01)
G01R 31/327    (2006.01)

(52) U.S. Cl.
CPC ........... *G05B 15/02* (2013.01); *G01R 31/327* (2013.01); *H01H 47/002* (2013.01); *H01H 47/22* (2013.01)

(58) Field of Classification Search
CPC .. G01R 31/327; G01R 31/3275; G05B 15/02; H01H 47/002; H01H 47/22
See application file for complete search history.

(56) References Cited

U.S. PATENT DOCUMENTS

| 6,118,252 | A | 9/2000 | Richter |
| 6,292,717 | B1 * | 9/2001 | Alexander ......... G01R 19/2513 340/6.1 |
| 8,532,002 | B1 | 9/2013 | Zats et al. |
| 9,753,088 | B2 * | 9/2017 | Ashtekar ............ G01R 31/3272 |
| 9,864,008 | B2 * | 1/2018 | Biswas .............. G01R 31/3275 |
| 2006/0176630 | A1 * | 8/2006 | Carlino ................ H02H 1/0061 361/64 |
| 2008/0140360 | A1 | 6/2008 | Goebel et al. |
| 2014/0145849 | A1 | 5/2014 | Huang et al. |
| 2015/0276877 | A1 | 10/2015 | Biswas et al. |

(Continued)

FOREIGN PATENT DOCUMENTS

DE    10 201 040 426 A1    4/2011
DE    10 2010 040 426 A1    4/2011
(Continued)

*Primary Examiner* — Abdelmoniem I Elamin
(74) *Attorney, Agent, or Firm* — Holland & Hart LLP

(57) ABSTRACT

The disclosure relates to a method for monitoring an electromechanical component of an automation system. The method may include acquiring of a mechanical state variable of the electromechanical component, acquiring of an electrical state variable of the electromechanical component, and determining of a state of the electromechanical component based on a multidimensional characteristic line field with a plurality of states of the electromechanical component, wherein the mechanical state variable and the electrical state variable are associated with each state of the electromechanical component.

18 Claims, 17 Drawing Sheets

(56) References Cited

U.S. PATENT DOCUMENTS

2016/0124048 A1* 5/2016 Ashtekar ............ G01R 31/3272
                                                            324/424
2016/0378102 A1* 12/2016 Goodrich ........... G05B 19/4155
                                                              700/9

FOREIGN PATENT DOCUMENTS

| | | |
|---|---|---|
| DE | 11 2005 001 085 B4 | 1/2014 |
| JP | 2011-210546 A | 10/2011 |
| RU | 146951 U1 | 10/2014 |
| WO | WO 2005/111641 A1 | 11/2005 |

* cited by examiner

METHOD FOR MONITORING AN ELECTROMECHANICAL COMPONENT OF AN AUTOMATION SYSTEM

CROSS-REFERENCE TO RELATED APPLICATION

This application claims priority to German patent application No. 10 2016 124 083.4, entitled "Verfahren zur Überwachung einer elektromechanischen Komponente eines Automatisierungssystems", and filed on Dec. 12, 2016 by the Applicant of this application. The entire disclosure of the German application is incorporated herein by reference for all purposes.

BACKGROUND

The present disclosure relates to the field of automation technology.

In the case of an electromechanical component in an automation system, for example, in the case of a switching device or a protective switching device, the state and the mode of operation of the electromechanical components can change depending on the ambient conditions. The causes of this are, for example, temperature changes, impact oscillations, component wear, contact wear of electrical switching contacts or mechanical wear of valves.

Currently, the prognosis of a service life of an electromechanical component is usually made based on empirical tests. In the process, it is typically assumed that the tested electromechanical components constitute a representative representation of the dispersion of the parameters and that the test results correspond to a statistically expected dispersion. Finally, from the test results, a prognosis is derived based on the wear behavior. In the case of electromechanical components, in particular relays, a Weibull distribution based on experimentally determined support sites has been found to be usable for the wear of switching contacts with regard to a failure time.

According to the determined Weibull distribution, it is then possible to derive a prognosis of the number of switching cycles, which is typically reached by a certain percentage of a population. A disadvantage of this approach is that the prognosis accuracy depends on the number of electromechanical components tested and on the ability of representing the actually occurring dispersion of the parameters. Another disadvantage is that the limit value determined in a concrete case of the use of an electromechanical component is typically set too conservatively. i.e., the maintenance intervals set occur excessively often and too frequently, and, as a result, the electromechanical components become oversized and unnecessarily expensive. Another disadvantage is that a number of electromechanical components in use fail before failure is expected, and consequently malfunctions, errors or even potentially dangerous failures can occur.

Therefore, the aim of the present disclosure is create an efficient design for monitoring an electromechanical component of an automation system.

SUMMARY

The aim is achieved by the features of the independent claims. Advantageous developments are the subject matter of the dependent claims, of the description and of the drawings.

According to a first aspect, the disclosure relates to a method for monitoring an electromechanical component of an automation system. The method may include an acquiring of a mechanical state variable of the electromechanical component, an acquiring of an electrical state variable of the electromechanical component, and determining of a state of the electromechanical component based on a multidimensional characteristic line field with a plurality of states of the electromechanical component, wherein a mechanical state variable and an electrical state variable are associated with each state of the electromechanical component.

Moreover, according to an example, in the multidimensional characteristic line field, a geometry parameter is associated with each state of the electromechanical component, wherein the method may include determining of a geometry parameter of the electromechanical component, and determining of the state of the electromechanical component based on the multidimensional characteristic line field, wherein the determined state is associated with the acquired mechanical state variable, the acquired electrical state variable and the geometry parameter.

According to an example, the multidimensional characteristic line field is represented by digital data values, in particular prestored digital data values. The digital data values can be prestored in a memory of the electromechanical component.

According to an example, the method may include an interpolation between support points of the multidimensional characteristic line field, in order to determine the state of the electromechanical component, wherein the support points are given by electrical state variables, by mechanical state variables and/or by geometry parameters.

According to an example, the method may include determining of the multidimensional characteristic line field based on a behavior model of the electromechanical component, wherein the behavior model takes into consideration an influence of the acquired mechanical state variable on the acquired electrical state variable.

According to an example, the multidimensional characteristic line field is determined by carrying out a behavior simulation of the electromechanical component, wherein the behavior simulation implements the behavior model.

According to an example, the method moreover may include a displaying of the determined state of the electromechanical component, in particular by means of a display device.

According to an example, the method moreover may include a generating of a control signal for controlling the electromechanical component in accordance with the determined state of the electromechanical component, and a controlling of the electromechanical component with the generated control signal.

According to an example, the mechanical state variable and the electrical state variable are acquired by the electromechanical component.

According to an example, the mechanical state variable may include one of the following mechanical state variables: a bouncing of a contact of the electromechanical component, a bounce duration of a bouncing of a contact of the electromechanical component, a bounce number of bounces of a contact of the electromechanical component, a temperature of an element of the electromechanical component, an ambient temperature of the electromechanical component, a movement speed of an element of the electromechanical component, in particular of an armature, of a contact force or of a disengagement force of a contact of the electromechanical component.

According to an example, the electrical state variable is a current through the electromechanical component or a voltage of the electromechanical component.

According to an example, the determined state of the electromechanical component is a service life of the electromechanical component.

According to an example, the electromechanical component is an electromechanical switch, in particular a relay.

According to a second aspect, the disclosure relates to an electromechanical component. The electromechanical component may include an acquiring device which is configured to acquire a mechanical state variable of the electromechanical component and an electrical state variable of the electromechanical component. The electromechanical component may include moreover a memory, in which a multidimensional characteristic line field with multiple states of the electromechanical component is stored, wherein a mechanical state variable and an electrical state variable are associated with each state of the electromechanical component. In addition, the electromechanical component may include a processor which is configured to determine a state of the electromechanical component based on the multidimensional characteristic line field.

The electromechanical component is configured to carry out the method. Additional features of the electromechanical component result directly from the features of the method.

According to a third aspect, the disclosure relates to a computer program with a program code for carrying out the method. The electromechanical component can be set up by software so as to execute the program code or portions of the program code.

The disclosure can be implemented in hardware and/or software.

BRIEF DESCRIPTION OF THE DRAWINGS

Examples of the present disclosure are explained in greater detail in reference to the appended figures.

DETAILED DESCRIPTION OF THE DRAWINGS

Figure 1:
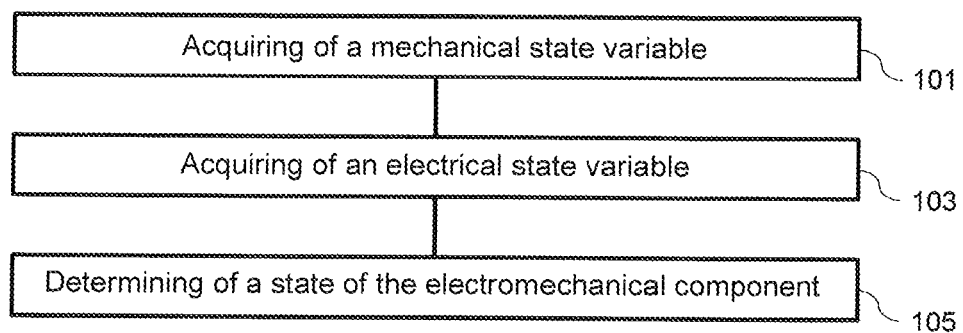
FIG. 1 shows a schematic diagram of a method for monitoring an electromechanical component of an automation system.

FIG. 1 shows a schematic diagram of a method 100 for monitoring an electromechanical component of an automation system. The method 100 may include acquiring 101 of a mechanical state variable of the electromechanical component, acquiring 103 of an electrical state variable of the electromechanical component, and determining 105 of a state of the electromechanical component based on a multidimensional characteristic line field with a plurality of states of the electromechanical component, wherein a mechanical state variable and an electrical state variable are associated with each state of the electromechanical component.

Figure 2:
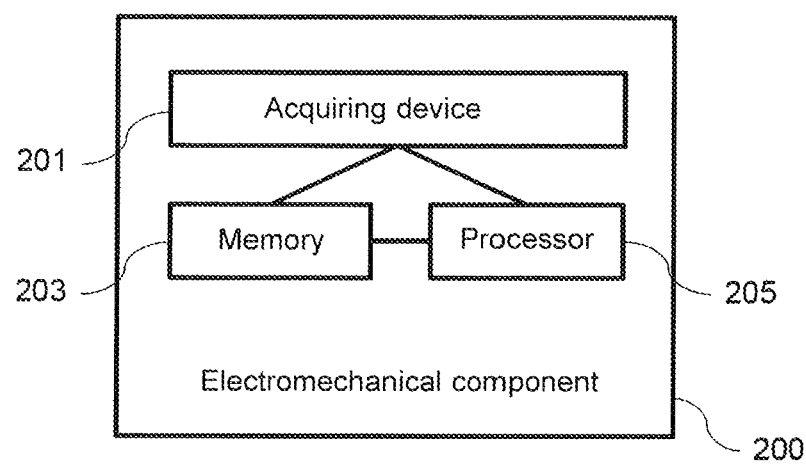
FIG. 2 shows a schematic diagram of an electromechanical component.

FIG. 2 shows a schematic diagram of an electromechanical component 200. The electromechanical component 200 may include an acquiring device 201 which is configured to acquire a mechanical state variable of the electromechanical component 200 and an electrical state variable of the electromechanical component 200. The electromechanical component 200 moreover may include a memory 203, in which a multidimensional characteristic line field with a plurality of states of the electromechanical component 200 is stored, wherein a mechanical state variable and an electrical state variable are associated with each state of the electromechanical component 200. In addition, the electromechanical component 200 may include a processor 205 which is configured to determine a state of the electromechanical component 200 based on the multidimensional characteristic line field.

Figure 3:
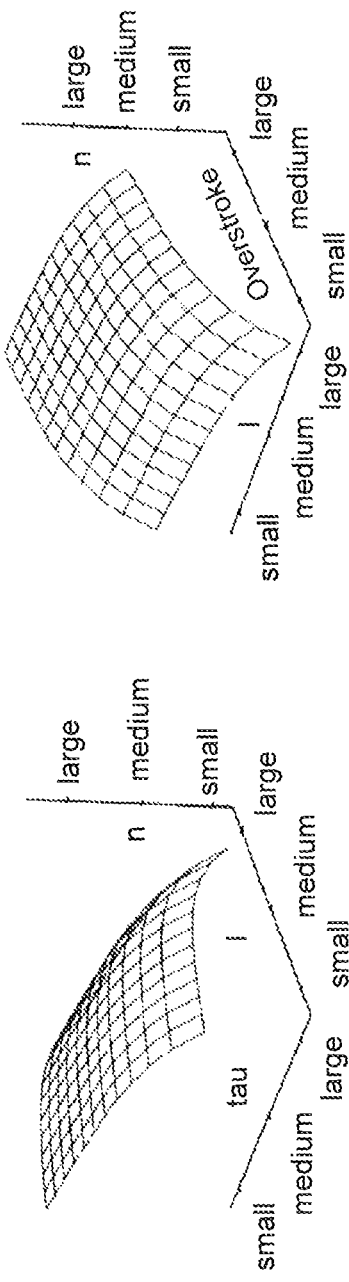
FIG. 3 shows schematic diagrams of multidimensional characteristic line fields.
Figure 3:
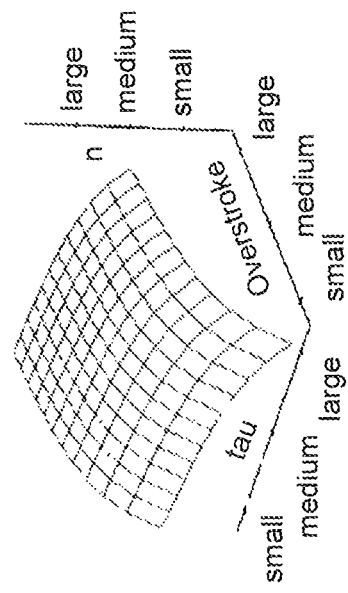

FIG. 3 shows schematic diagrams of multidimensional characteristic line fields. The multidimensional characteristic line fields can represent a behavior model for the description of a state, for example, of a service life, for an electromechanical component, for example, a relay. The description of the state can occur by means of the behavior model with which a prognosis of the state can be made, for example, taking into consideration the load conditions, the ambient conditions and the geometry parameters.

The concept can then consist in that experimentally determined states of the electromechanical component, for example, service life values, are represented in the behavior model taking into consideration the load conditions, the ambient conditions, the mechanical state variables, the electrical state variables and/or the geometry parameters, in order to derive a prognosis of the expected state, for example, of the service life in the sense of the reliability.

In the process, for example, a load to be switched can be associated with load ranges each of which is characterized by the same failure mechanism but different load strengths. Examples are:

DC voltage/AC voltage;

inductive load/resistive load/capacitive load and combinations; or low load or contact interruption.

As a result, a characteristic line field can be set up, which represents a state, for example, a service life, of an electromechanical component depending on the load conditions, the ambient conditions, the mechanical state variables, the electrical state variables and/or the geometry parameters.

In particular, the following steps can be carried out for this purpose:

Step 1: Recording of all the relevant electrical state variables, mechanical state variables, geometry parameters and—if desired—additional parameters of each electromechanical component to be tested.

Step 2: Establishment and/or determining of the load ranges and definition of selected loads which sufficiently represent the load ranges, for example, maximum value, average value and minimum value.

Step 3: Performance of the tests at the selected sites of the defined load ranges with different parameters, for example, overstroke, contact spacing, resetting force and bounce time.

Step 4: Preparation of the behavior model based on the test results taking into consideration the variation or dispersion of the parameters.

The use of the prognosis based on a multidimensional characteristic line field occurs by deriving the expected state from the characteristic line field, taking into consideration the characteristic values of the electromechanical component, for example, overstroke, contact spacing, resetting force or bounce time. Taking into consideration already completed switching cycles, it is possible, for example, to prognosticate the residual service life.

An example of the use of this behavior model is a representation of an actual electromechanical component, for example, of a relay with electronics and firmware, in which the characteristic values that are important for the electrical service life are determined or measured during ongoing operation, and a residual service life is to be derived, taking into consideration the switched load with voltage/current over the contact, already completed switching cycles and/or ambient conditions.

In the case of a failure expected to occur within a certain time due to a high number of switching cycles, the automation system can be maintained preventatively or the electromechanical component can be replaced. The integration of this behavior model in a system model by means of a multidimensional characteristic line field is advantageous.

Below, additional examples of the method 100 and of the electromechanical component 200 are described in further detail.

The method 100 enables an analysis and monitoring of the electromechanical component 200 using a multidimensional characteristic line field which can be determined on the basis of a behavior model. For this purpose, a behavior simulator can be used. The electromechanical component 200 can be a switching device, for example. The concept makes it possible to represent a behavior of the electromechanical component 200 by means of the multidimensional characteristic line field, using the state variables acquired from the actual electromechanical component 200, which can be characteristic values.

In the behavior simulation or system simulation, the components of different domains, which are present in an automation system, are represented in behavior models and linked via state variables or action variables, for example, via a current, a force, a flow or a logical state. The advantage of the behavior simulation consists, for example, in that the effect and feedback effect of the state variables can be taken into consideration. Thus, for example, feedback effects of mechanical systems on electromagnetic and electrical systems can be represented.

The behavior simulation thus represents a state of the electromechanical component 200. Thus, for example, values and changes of the mechanical or electrical state variables can be acquired.

In addition to the representation in behavior models with bidirectional flow of the state variables, complex behavior models can be represented via metamodels and integrated in the behavior simulation. The use of metamodels is advantageous, for example, in the representation of a reliability behavior of electrical contacts as a function of a load, a mechanical overstroke, a contact spacing, a contact force, a resetting force, a time-dependent bouncing or an opening speed. Furthermore, due to the integration of metamodels, a failure probability can be determined by means of the acquired state variables, and, in the case of a potentially dangerous state, a switching off of the automation system can be carried out.

The behavior model or simulation model typically may include objects from the following domains:

electrical, for example, electronic circuits, sensors such as photoelectric sensors, or switches;

magnetic, for example, reed contacts, sensors;

electromagnetic, for example, relays, shields, valves, Hall sensor;

fluids, for example, pressure valves, nozzles;

thermal sources, for example, load resistors, heaters, fans, coolers;

software objects, for example, firmware blocks, PWM, OSSD; and metamodels for the representation of stochastic connections.

Figure 4A:
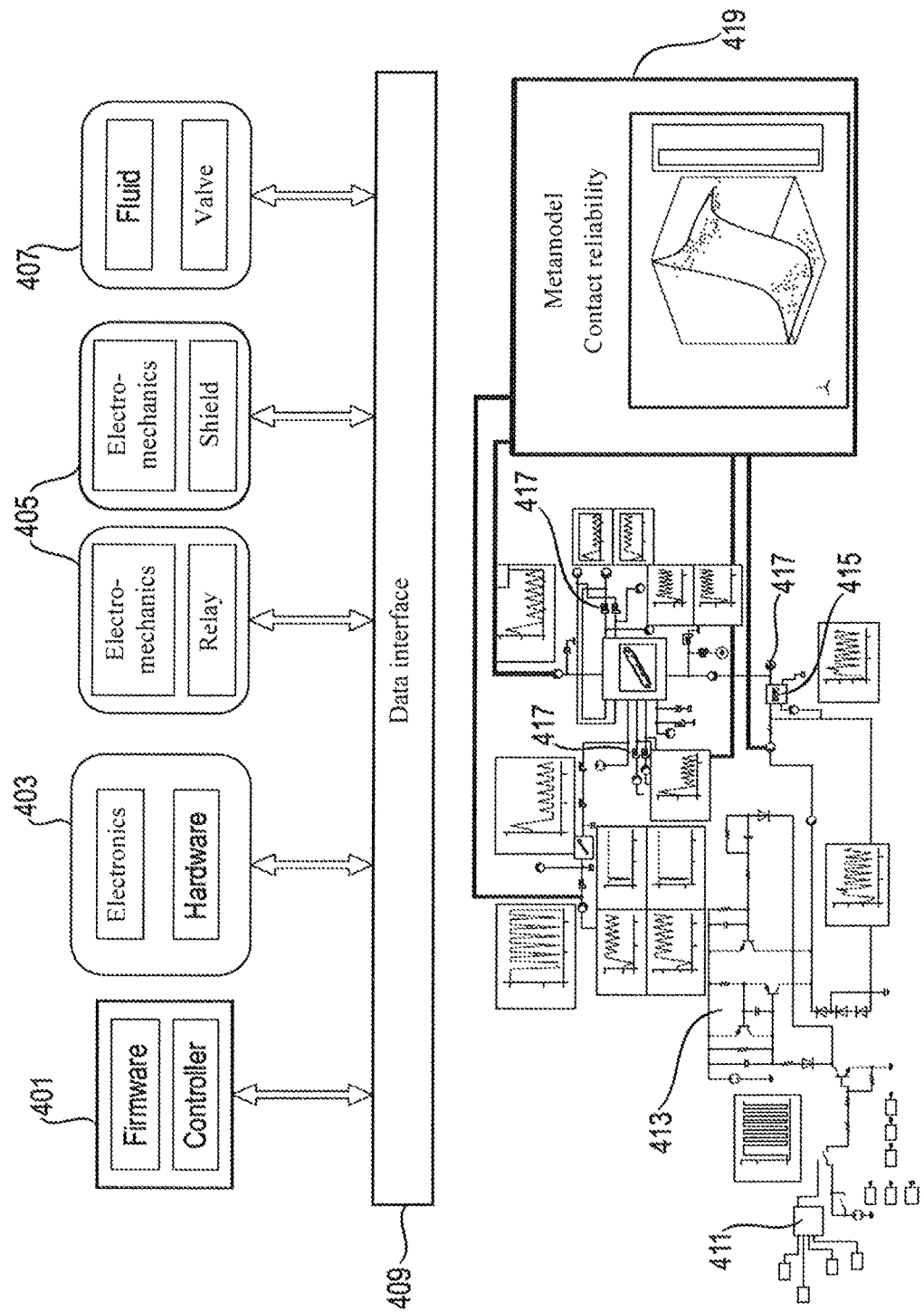
FIG. 4a shows a schematic diagram of a behavior model for determining a multidimensional characteristic line field.
Figure 4B:
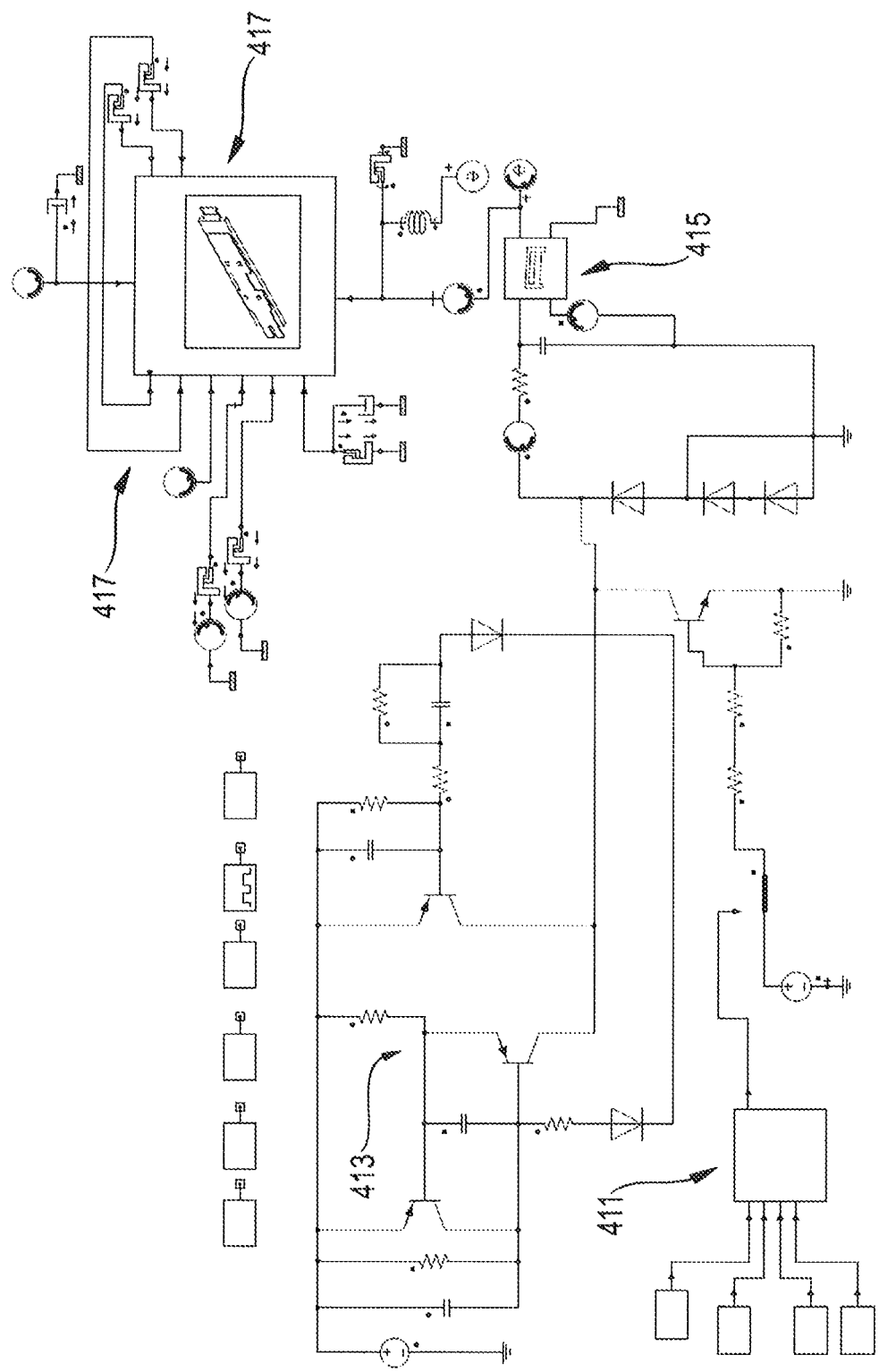
FIG. 4b shows a schematic diagram of a behavior model for determining a multidimensional characteristic line field.

FIG. 4a and FIG. 4b show a schematic diagram of a behavior model for determining a multidimensional characteristic line field. The behavior model relates, for example, to an electromechanical switching device as electromechanical component. The diagram shows a firmware component 401, an electronics component 403, an electromechanics component 405, a fluid component 407, and a data interface 409 for the bidirectional data transfer. The diagram moreover shows a firmware module 411, an electronics module 413, an electromagnetics module 415, a mechanics module 417, and a metamodel module 419 for determining a contact reliability as state of the electromechanical component.

By carrying out a behavior simulation based on the behavior model, the multidimensional characteristic line field can be determined, which represents mechanical state variables and electrical state variables of the electromechanical component on the state of the electromechanical component.

Figure 4C:
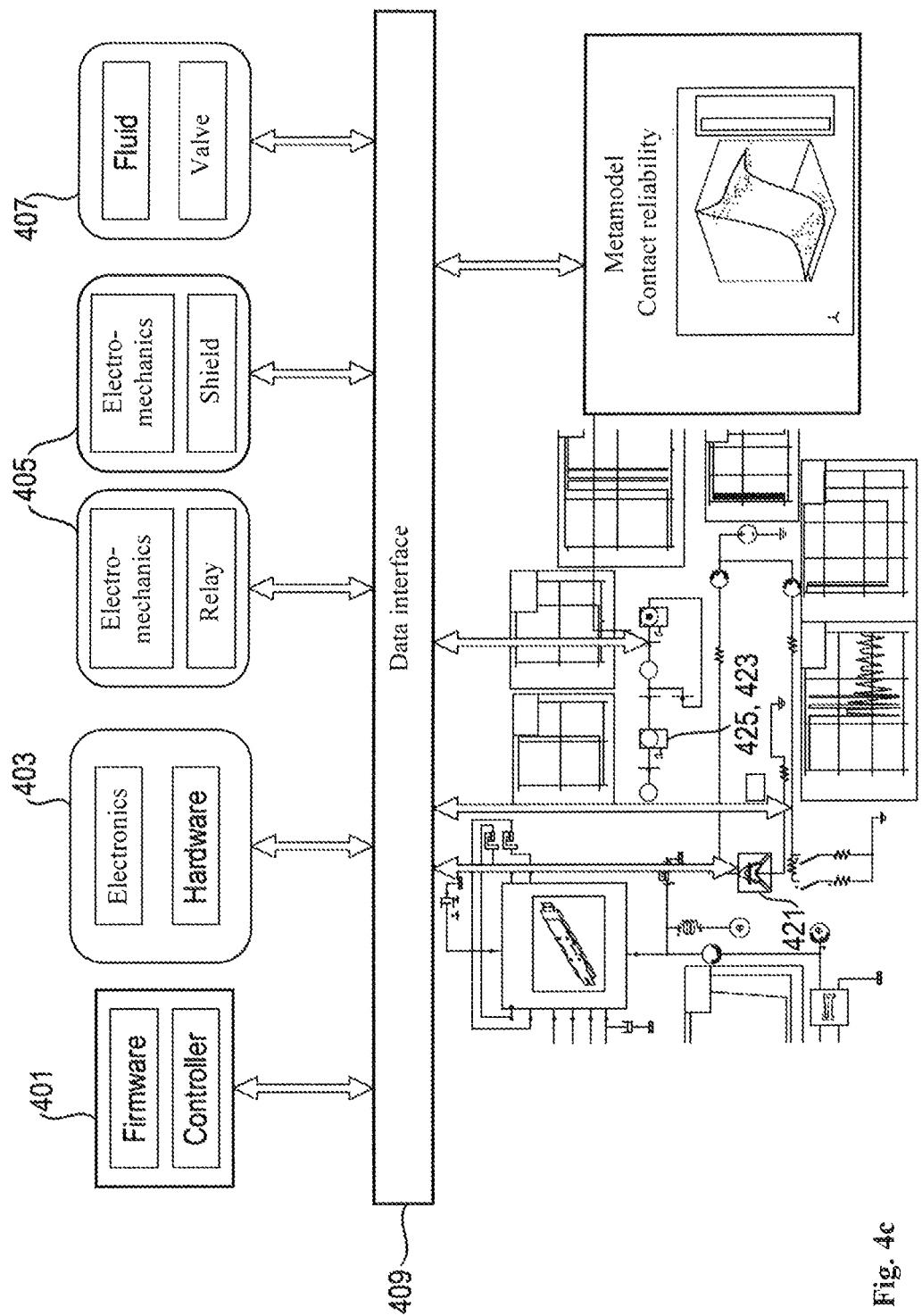
FIG. 4c shows a schematic diagram of a behavior model for determining a multidimensional characteristic line field.
Figure 4D:
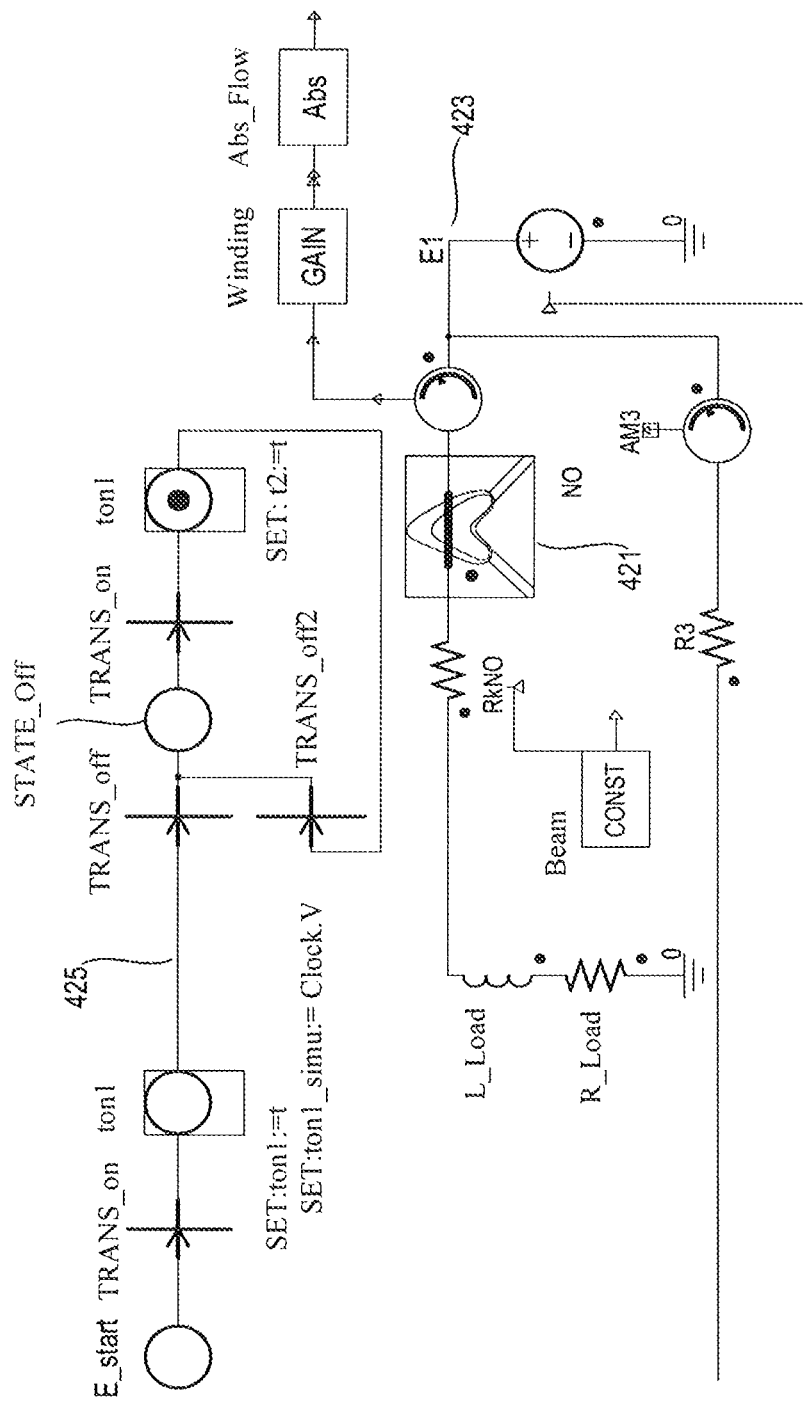
FIG. 4d shows a schematic diagram of a behavior model for determining a multidimensional characteristic line field.

FIG. 4c and FIG. 4d show a schematic diagram of a behavior model for determining a multidimensional characteristic line field. The behavior model relates, for example, to an electromechanical switching device as electromechanical component. The diagram shows a firmware component 401, an electronics component 403, an electromechanics component 405, a fluid component 407, and a data interface 409 for the bidirectional data transfer. The diagram moreover shows an object 421 for the determining of an electric arc discharge duration as state of the electromechanical component, an object 423 for the determining of a bouncing behavior of contacts as state of the electromechanical component, and an object 425 for the determination of a contact resistance as state of the electromechanical component, which can be used optionally or additionally.

By carrying out a behavior simulation based on the behavior model, the multidimensional characteristic line field can be determined, which represents mechanical state variables and electrical state variables of the electromechanical component on the state of the electromechanical component.

FIG. 5a to FIG. 5f show schematic diagrams of time curves of state variables of electromechanical components. Below, two examples are explained in further detail.

First Example

In the case of loads with high switch-on current, for example, in the case of shields or motors, the service life of a contact of a relay as electromechanical component depends strongly on the bouncing behavior during the switching on of the contact.

If the contact is not bounced or if the bounce time is shorter than 0.1 µs, so that a switch-on electric arc can usually not form, there is less contact wear due to heating by the switch-on electric arc than in the case of bouncing contacts with a bounce time of typically more than 1 to 5 ms and a bounce number between 2 and 5. If critical values, for example, critical values of the bounce number or of the bounce duration, are exceeded, the load contact may be permanently welded and thus the load can remain switched on, which may represent a potentially dangerous state.

The change in the bouncing behavior can occur as a result of a plurality of influences, for example, a switching cycle number on the load contact, an influence of an ambient temperature or of mechanical wear, an influence of a control voltage or of fatigue of contact springs.

In this example, the bouncing behavior, in particular the bounce number or the bounce duration, of the load contact is determined. In the case of changes having the effect that the bouncing behavior changes to critical values with regard to the bounce number or the bounce duration, information on this state change is made available to the electromechanical component. Subsequently, for example, a warning to a user can occur, or a switching off can be carried out at an appropriate time before a failure and thus before a critical state.

The determining of the bouncing behavior can occur in that the load current is acquired by means of a current sensor, for example, a reed contact, and the mechanical feedback effect of the contact bouncing on the control current of the relay coil is acquired. In the case of bouncing contacts, the load current is switched off briefly by the opened contact. In the case of high loads, an electric arc can form between the open contacts. The acquiring of the interruption and/or change of the load current can be challenging, if the load voltage is very high, for example, at grid voltage, and thus the remaining source voltage changes only very slightly due to the forming electric arc.

Figure 5A:
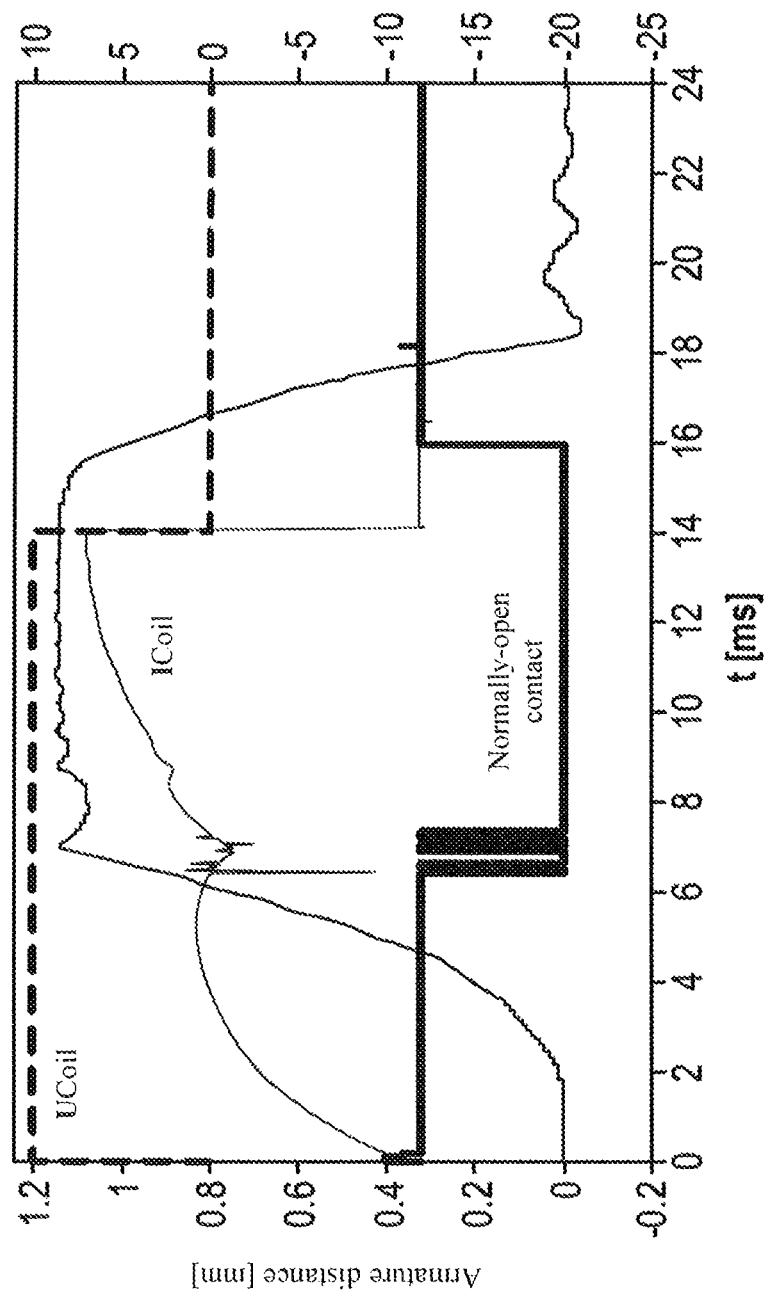
FIG. 5a shows schematic diagrams of time curves of state variables of an electromechanical component.

Therefore, in addition or in parallel, the mechanical influence of the bouncing contact on the control current of the coil can be determined. In FIG. 5a, the excitation voltage of the relay coil, the coil current, the contact current at the normally open contact, and the armature movement are represented. These state variables can be acquired by measurement technology. Here, it is evident that the bounce pulses of the normally open contact have an effect on the coil current. This influence on the coil current can be determined and evaluated by measurement technology.

Figure 5B:
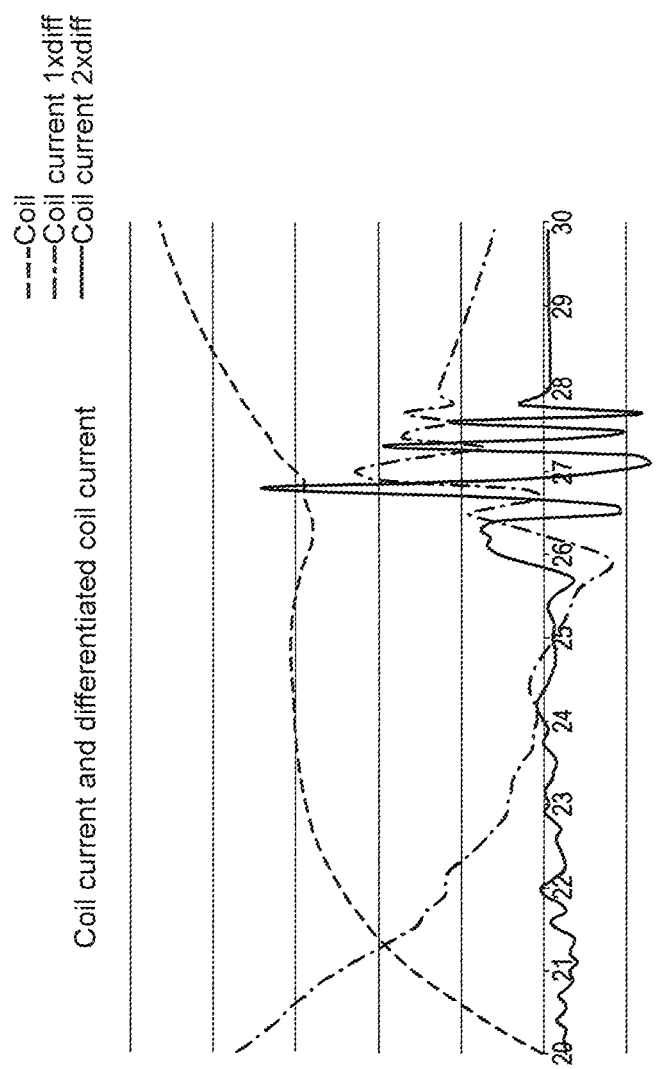
FIG. 5b shows schematic diagrams of time curves of state variables of an electromechanical component.

One evaluation possibility consists in differentiating the coil current 1 to 2 times in order to acquire the change in the coil current, as shown in FIG. 5b, for example. After the first contact has been established, the bounce pulses can be identified as zeros after the coil current has been differentiated 2 times. From the number and the duration of the zeros, one can identify on the control side the number and the duration of the contact bounce pulses.

Another possible use is the analysis of the causes of contact bounce pulses and optionally a correction during ongoing operation. One cause of occurring bounce pulses can be, for example, a heating of the relay and an associated increase of the coil resistance. Due to this effect, the coil current for the excitation of the relay is reduced, which can simultaneously entail a reduction of the force of the magnet system and, associated therewith, an increase of the bounce duration or of the number of bounce pulses.

Other possibilities are the changes of the mechanical parameters, for example, due to friction or fatigue, and thus changes of the kinetic conditions when the contact is established. In order to determine the causes for this, a comparison of the determined state variables of the behavior model under variation of the relay parameters and of the measured state variables of the actual object is possible. By optimizing the model parameters with the goal of minimal deviation of a model characteristic, for example, of the differentiated coil current and of the measured differentiated coil current, the parameters that determine the changed behavior of the actual object and their value can be determined. Based on this finding, it is possible, for example, by changing the control characteristic, for example, a current increase, a voltage value, a pulse form, a pulse duration, a pulse frequency in a pulse width modulation (PWM), to influence a control of the bouncing behavior in such a manner that the number or duration of the bounce pulses is minimized, and thus the time at which a critical state, for example, a permanently welded contact, is reached can be moved backward.

Second Example

For reducing the control power of relays, a PWM control is often selected. This has the advantage that, after switching-on, the relay coil can be operated with a cycled voltage which is sufficient to maintain the operating state. Since the relay parameters can exhibit dispersion, the pulse width is typically selected in such a manner that this operating state is maintained for all possible relays, even under worst-case conditions. However, since there are only a very few relays—in normal-distribution processes <<0.1%—which require these worst-case conditions, the remaining overwhelming majority is controlled with a higher power than necessary. This leads to heating and to challenges, particularly in the case of a large number of simultaneously controlled relays.

The concept consists in that the optimal power for the respective relay is to be acquired, for example, by means of a pulse-pause ratio, and the control is to be set at a minimum in such a manner that the operating position is always maintained.

The sequence occurs usually as follows:

Step 1: Excitation of the relay in the switch-on time period with full voltage until the final position has been securely reached.

Step 2: PWM keying of the operating voltage and measurement of the coil current.

Step 3: At the start of the armature movement—which can be identified from an increase of the coil voltage—, change of the pulse ratio in such a manner that the armature remains again securely in the operating position.

Figure 5C:
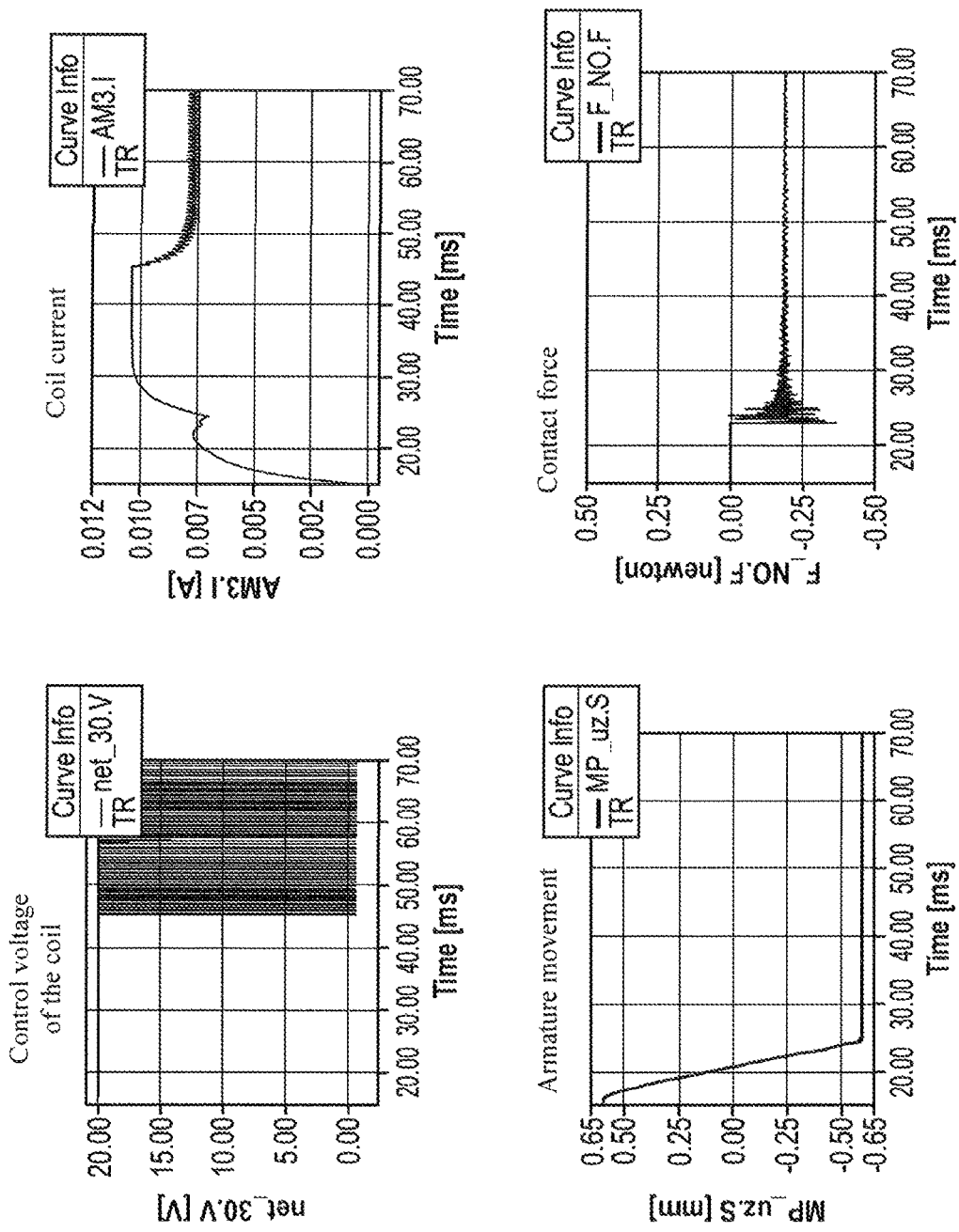
FIG. 5c shows schematic diagrams of time curves of state variables of an electromechanical component.
Figure 5D:
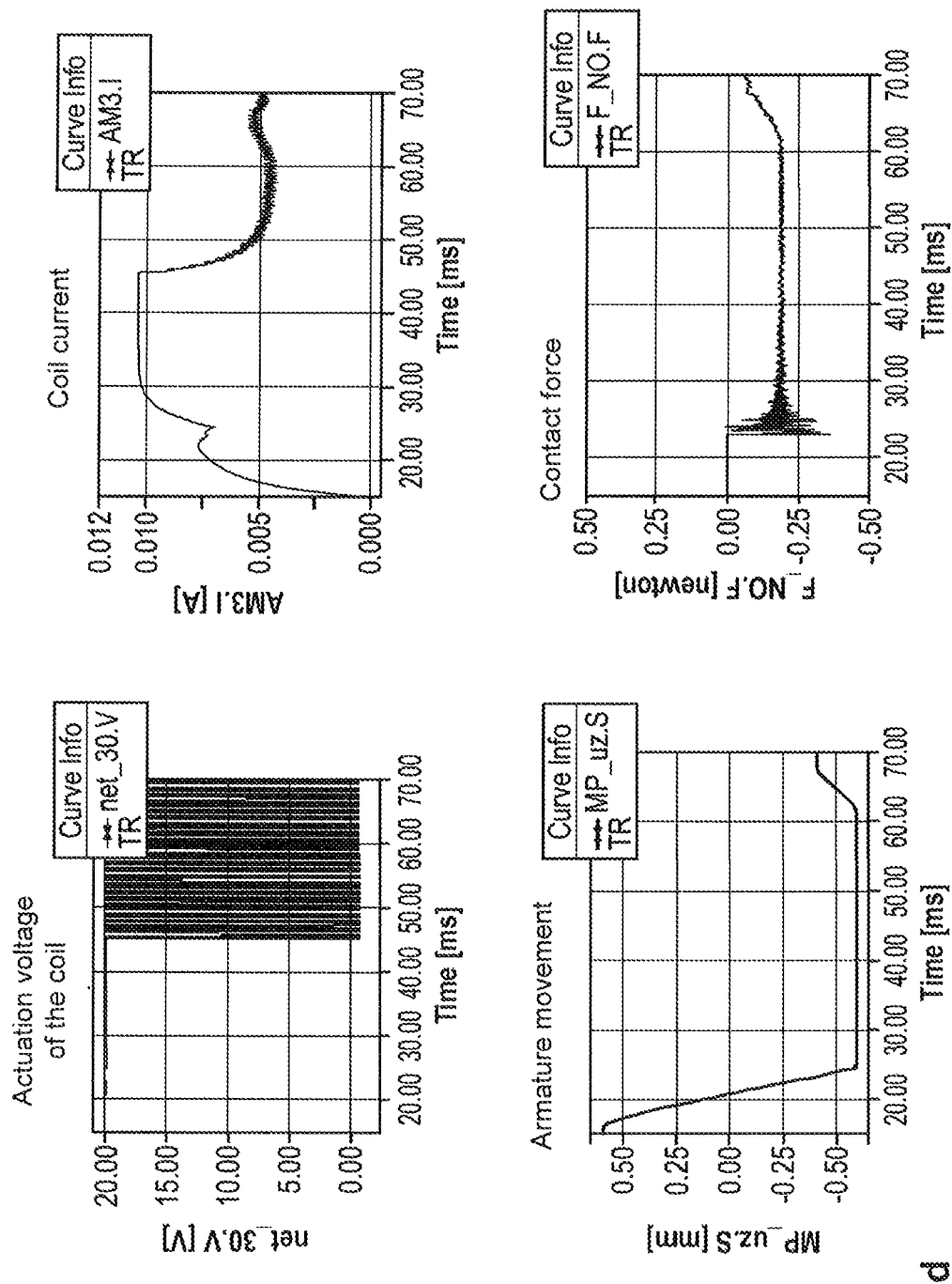
FIG. 5d shows schematic diagrams of time curves of state variables of an electromechanical component.
Figure 5E:
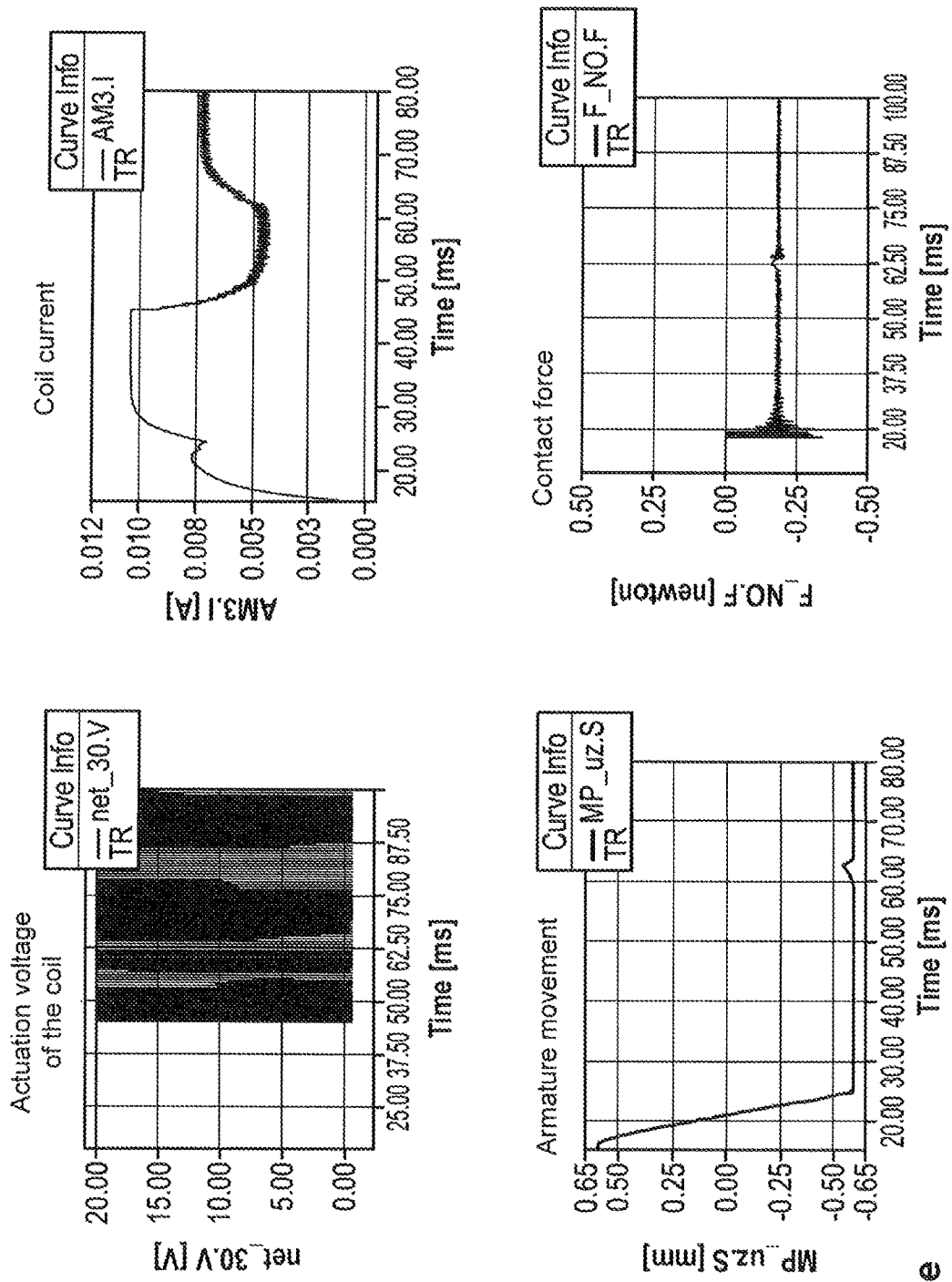
FIG. 5e shows schematic diagrams of time curves of state variables of an electromechanical component.
Figure 5F:
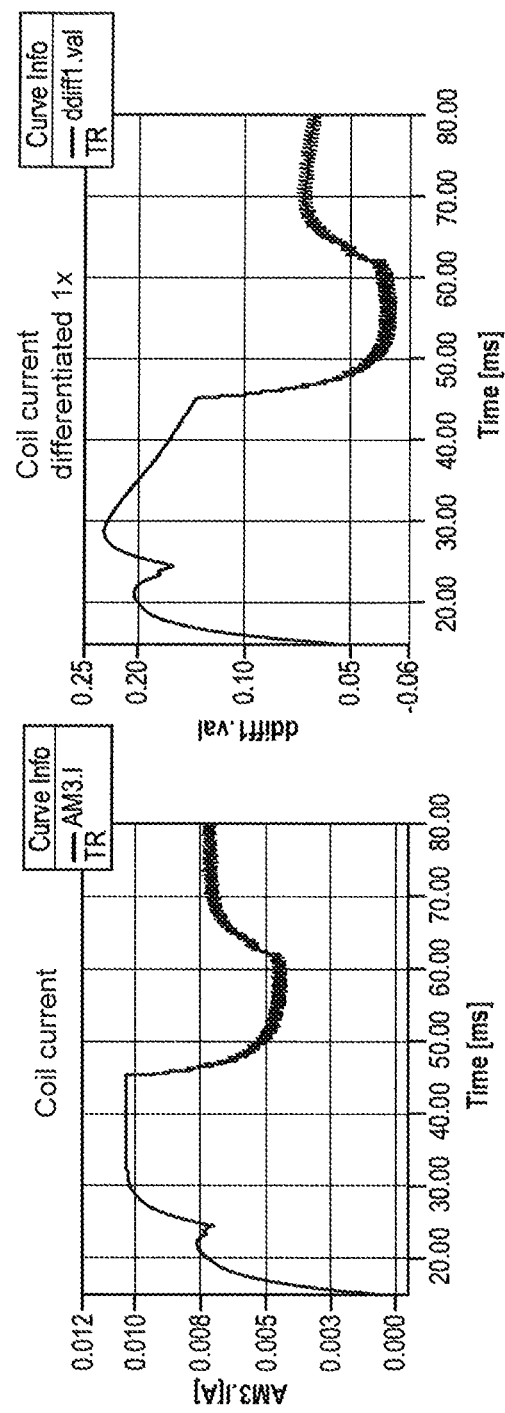
FIG. 5f shows schematic diagrams of time curves of state variables of an electromechanical component.
Figure 6A:
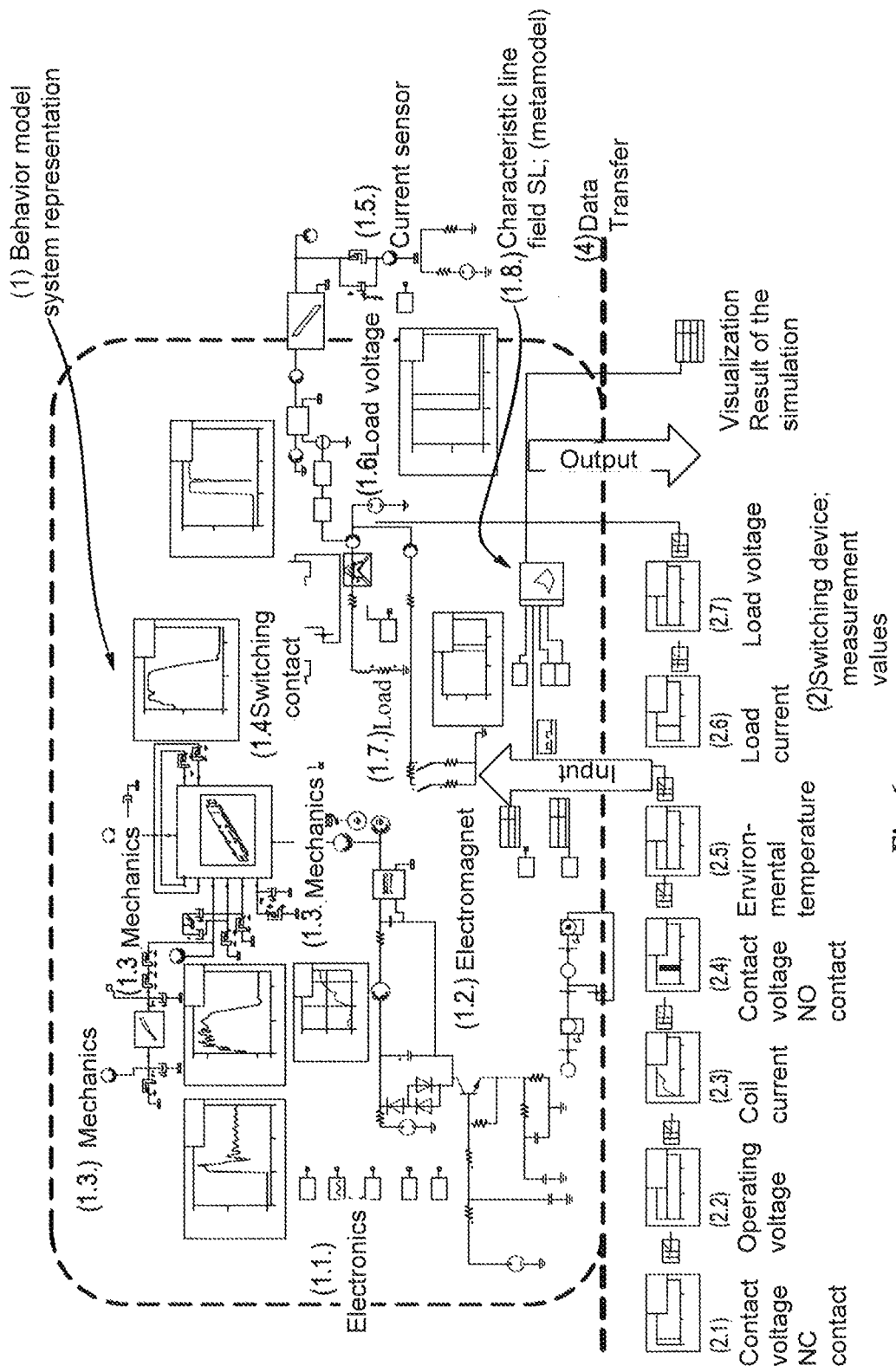
FIG. 6a shows a schematic diagram of behavior model for determining a multidimensional characteristic line field.
Figure 6B:
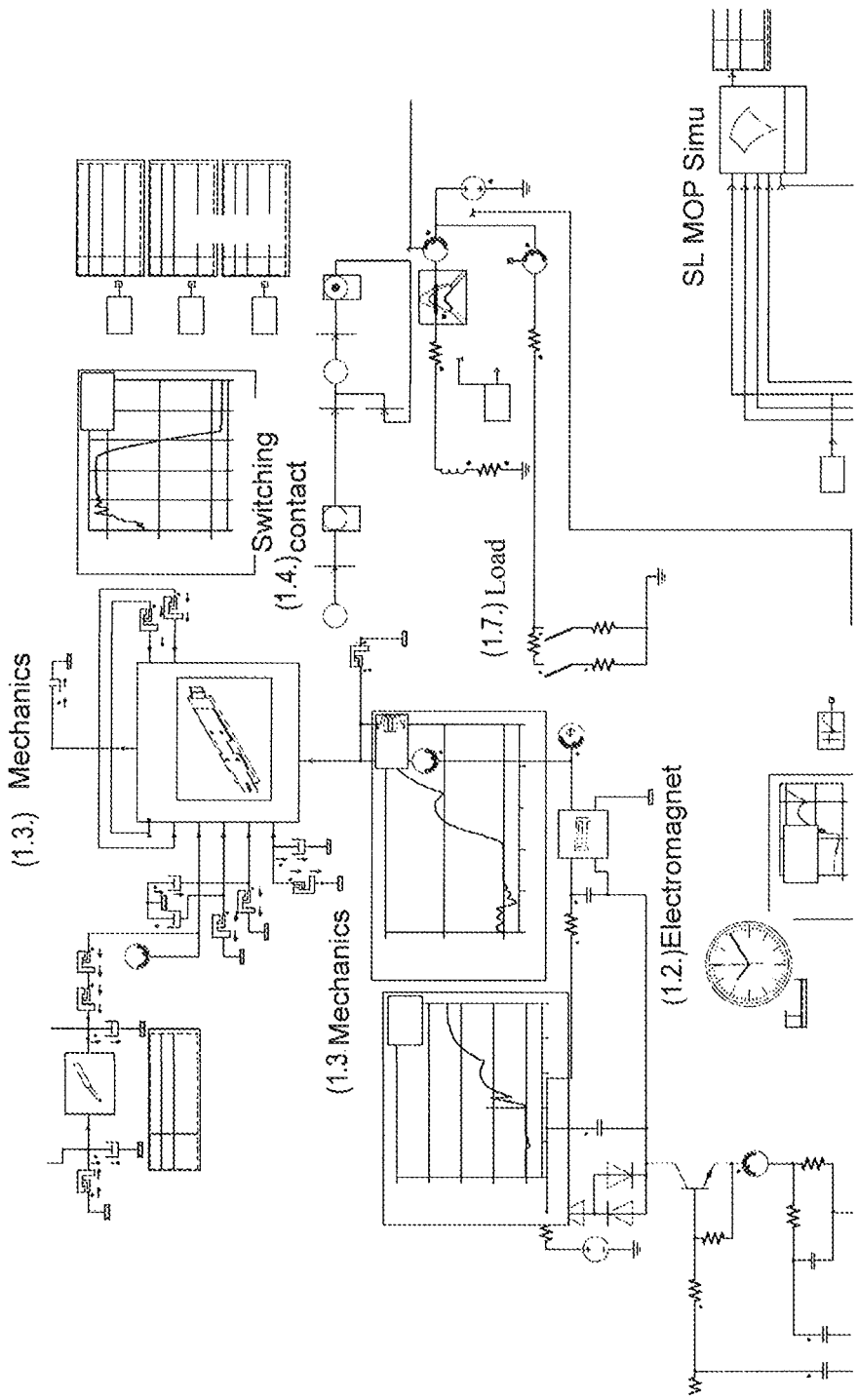
FIG. 6b shows a schematic diagram of a behavior model for determining a multidimensional characteristic line field.
Figure 6C:
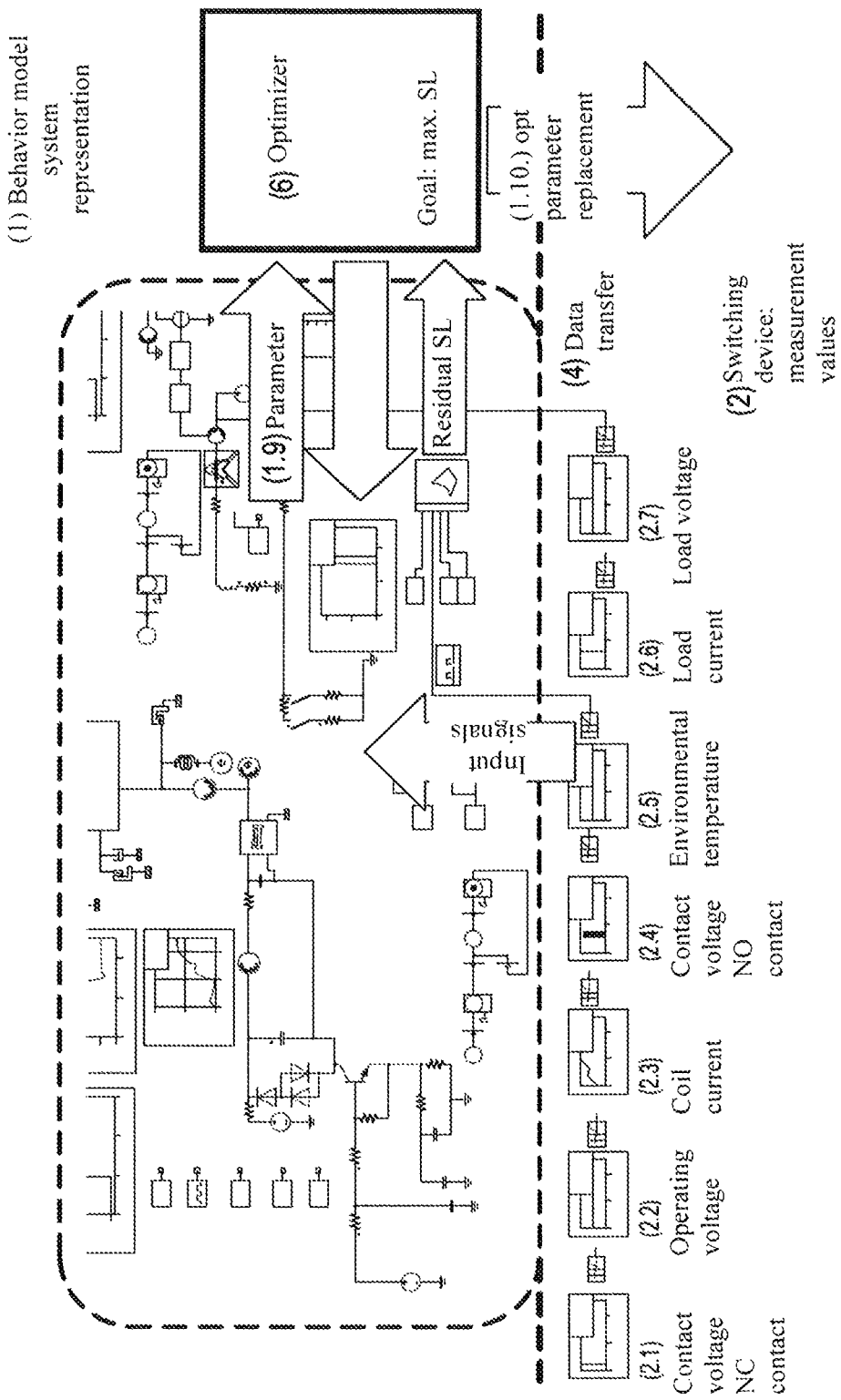
FIG. 6c shows a schematic diagram of a behavior model for determining a multidimensional characteristic line field.
Figure 6D:
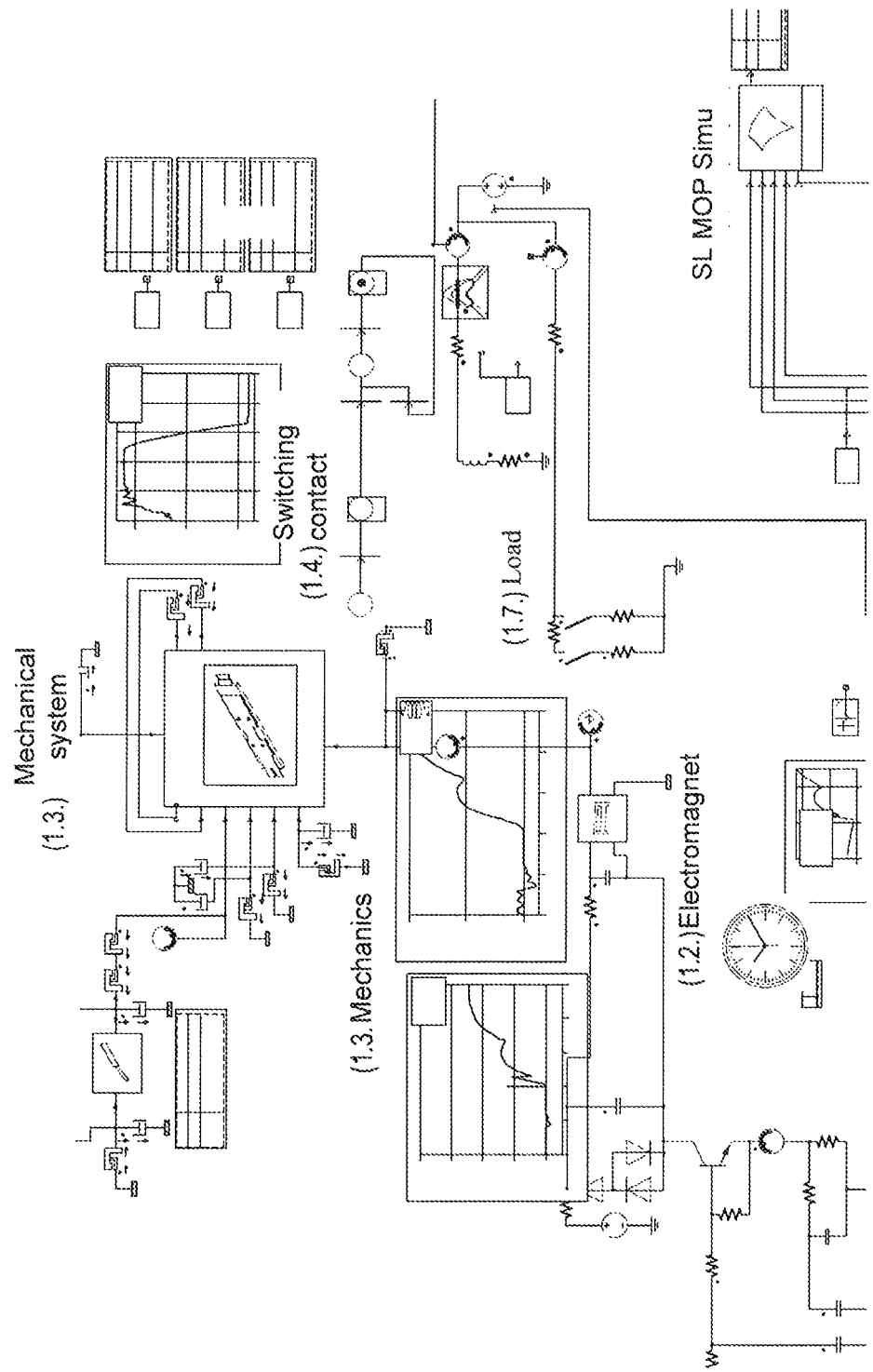
FIG. 6d shows a schematic diagram of a behavior model for determining a multidimensional characteristic line field.

In FIG. 5c, an example of the curve of the control voltage, of the coil current, the movement of the armature and the contact force under normal conditions are represented. After 45 ms, the coil voltage is switched over to a PWM configured in such a manner that the armature remains in the operating position. FIG. 5d shows an example of a case in which the allocated PWM is insufficient, so that after a delay time of approximately 62 ms, the armature starts to separate from the final position and thus the contact force is also reduced. FIG. 5e and FIG. 5f show a state in which the armature movement is detected, in that the coil current is differentiated and the armature movement is detected by a positive zero crossing of the differentiated armature current. With this signal, the PWM is now changed so that, for example, by an increase of the duty value, the armature immediately reaches the final position again in a reliable manner. The resulting remaining armature movement is minimal, and the contact force at the load contact remains practically unchanged, as shown in FIG. 5e.

FIG. 6a, FIG. 6b, FIG. 6c and FIG. 6d show a schematic diagram of a behavior model for determining a multidimensional characteristic line field. The physical behavior model of the electromechanical component can form a "digital twin" of the electromechanical component. The behavior model can be implemented by means of a behavior simulator and used for the determining of a multidimensional characteristic line field.

The behavior model (1), as system representation, may include physical models of all the components of the electrical component, such as, for example:
(1.1) Electronics (control circuit relay, including switching request block);
(1.2) Electromagnet (magnet system relays);
(1.3) Mechanics (contact spring, resetting springs relays);
(1.4) Switching contact (model contact resistor, electric arc switching contact relays);
(1.5) Current sensor (sensor load current);
(1.6) Load voltage;
(1.7) Load (resistance, inductance, capacitance); and
(1.8) Characteristic line field service life.

For this purpose, results of tests and associated parameters can be represented in a replacement model or metamodel similar to a characteristic line field. Here, it can be advantageous to generate different models for different load types, for example, direct current or alternating current, as well as for different failure mechanisms, for example, a contact that does not open, as a potentially dangerous failure, or a contact that does not close. The generation of a replacement model occurs, for example, by means of the MOP (Metamodel of Optimal Prognosis) method.

The state variables may include, for example:
(2.1) Contact voltage NC contact;
(2.2) Operating voltage control circuit;
(2.3) Coil current relays;
(2.4) Contact voltage NO contact (load contact);
(2.5) Ambient temperature;
(2.6) Load current; and
(2.7) Load voltage.

Now, a simulation of the behavior of the electromechanical component takes place. For this purpose, for example, internal parameters are obtained from the simulation, which cannot be detected by measurement technology, but which can be relevant for the behavior (for example, failure/service life), for example, an overstroke of the load contact or a friction path of the load contact.

In addition, the measurement values transmitted as signals are converted by mathematical operations such as, for example, integral operations, transformations or derivations, in such a manner that the characteristic properties of the signals can be represented, for example, by coefficients. These coefficients can be represented and processed in a manner similar to normal parameters.

The transmitted measurement values and the parameters determined therefrom in the simulation as well as the parameters determined with the behavior model in the simulations are, for example, processed in at least one metamodel for the prognosis of a failure behavior, for example, of a remaining switching cycle number.

The state variables or states are output and visualized. In the case of a clear reduction of the expected residual service life or of a low residual service life, it is possible to avoid an unexpected failure, for example, by means of preventive maintenance. In the case of a remaining long residual service life, a planned maintenance can be postponed, for example.

In another application, an active influencing or optimization of the electromechanical component occurs by changing settable parameters (1.9) such as, for example:
an operating voltage;
a PWM duty value; or
a switching sequence in case of redundancy.

For this purpose, at the level of the simulation model, an optimizer (6) can optimize the results of the simulation, for example, the residual service life, under variation of simulation parameters (1.9), for example, relay characteristic values, so that an optimal parameter set (1.10) is found, in which, for example, a highest possible residual service life is reached.

All the features described and shown in connection with individual examples can be provided in different combinations in the inventive subject matter in order to simultaneously achieve the advantageous effects thereof.

LIST OF REFERENCE NUMBERS

100 Method for monitoring an electromechanical component
101 Acquiring of a mechanical state variable
103 Acquiring of an electrical state variable
105 Determining of the state of the electromechanical component
200 Electromechanical component
201 Acquiring device
203 Memory
205 Processor
401 Firmware component
403 Electronics component
405 Electromechanics component
407 Fluid component
409 Data interface
411 Firmware module
413 Electronics module
415 Electromagnetic module
417 Mechanics module
419 Metamodel module
421 Object
423 Object
425 Object

What is claimed is:
1. A method for monitoring an electromechanical component of an automation system, comprising:
acquiring a mechanical state variable of the electromechanical component;
acquiring an electrical state variable of the electromechanical component;
determining a multidimensional characteristic line field with a plurality of states of the electromechanical component based on a behavior model of the electro- mechanical component, wherein the behavior model considers an influence of the acquired mechanical state variable on the acquired electrical state variable; and determining a state of the electromechanical component based on the multidimensional characteristic line field with a plurality of states of the electromechanical component, wherein the mechanical state variable and the electrical state variable are associated with each state of the electromechanical component;

wherein the multidimensional characteristic line field is determined by performing a behavior simulation of the electromechanical component, wherein the behavior simulation implements the behavior model.

2. The method according to claim 1, wherein a geometry parameter is associated with each state of the electromechanical component in the multidimensional characteristic line field, and the method further comprises:

determining the geometry parameter of the electromechanical component; and determining the state of the electromechanical component based on the multidimensional characteristic line field, wherein the determined state is associated with the acquired mechanical state variable, the acquired electrical state variable and the geometry parameter.

3. The method according to claim 1, wherein the multidimensional characteristic line field is represented by digital data values, in particular prestored digital data values.

4. The method according to claim 3, wherein the digital data values are prestored digital data values.

5. The method according to claim 1, further comprising:
interpolating between support points of the multidimensional characteristic line field to determine the state of the electromechanical component, wherein the support points are given by one or more of electrical state variables, mechanical state variables, and geometry parameters.

6. The method according to claim 1, further comprising:
displaying the determined state of the electromechanical component.

7. The method according to claim 6, wherein the determined state of the electromechanical component is displayed using a display device.

8. The method according to claim 1, further comprising:
generating a control signal to control the electromechanical component in response to the determined state of the electromechanical component; and
controlling the electromechanical component with the generated control signal.

9. The method according to claim 1, wherein the mechanical state variable and the electrical state variable are acquired by the electromechanical component.

10. The method according to claim 1, wherein the mechanical state variable comprises one of the following mechanical state variables: a bouncing of a contact of the electromechanical component, a bounce duration of a bouncing of a contact of the electromechanical component, a bounce number of bounces of a contact of the electromechanical component, a temperature of an element of the electromechanical component, an ambient temperature of the electromechanical component, a movement speed of an element of the electromechanical component of a contact force, or a disengagement force of a contact of the electromechanical component.

11. The method according to claim 10, wherein the movement speed of the element of the electromechanical component is of an armature.

12. The method according to claim 1, wherein the electrical state variable is a current through the electromechanical component or a voltage of the electromechanical component.

13. The method according to claim 1, wherein the determined state of the electromechanical component is a service life of the electromechanical component.

14. The method according to claim 1, wherein the electromechanical component is an electromechanical switch.

15. The method according to claim 14, wherein the electromechanical switch is a relay.

16. An electromechanical component, comprising:
an acquiring device configured to acquire a mechanical state variable of the electromechanical component and an electrical state variable of the electromechanical component;

a memory configured to store a multidimensional characteristic line field with a plurality of states of the electromechanical component, wherein a mechanical state variable and an electrical state variable are associated with each state of the electromechanical component; and a processor configured to:
determine the multidimensional characteristic line field based on a behavior model of the electromechanical component, wherein the behavior model considers an influence of the acquired mechanical state variable on the acquired electrical state variable; and
determine a state of the electromechanical component based on the multidimensional characteristic line field.

17. A non-transitory computer-readable medium storing computer-executable code for monitoring an electromechanical component of an automation system, the code executable by a processor to:

acquire a mechanical state variable of the electromechanical component;

acquire an electrical state variable of the electromechanical component;

determine a multidimensional characteristic line field based on a behavior model of the electromechanical component, wherein the behavior model considers an influence of the acquired mechanical state variable on the acquired electrical state variable; and determine a state of the electromechanical component based on a multidimensional characteristic line field with a plurality of states of the electromechanical component, wherein the mechanical state variable and the electrical state variable are associated with each state of the electromechanical component;

wherein the multidimensional characteristic line field is determined by performing a behavior simulation of the electromechanical component, wherein the behavior simulation implements the behavior model.

18. The non-transitory computer-readable medium according to claim 17, wherein the instruction are further executable by the processor to:

determine a geometry parameter of the electromechanical component; and determining the state of the electromechanical component based on the multidimensional characteristic line field, wherein the determined state is associated with the acquired mechanical state variable, the acquired electrical state variable, and the geometry parameter.

* * * * *